US011482688B2

(12) United States Patent
Yuan et al.

(10) Patent No.: US 11,482,688 B2
(45) Date of Patent: Oct. 25, 2022

(54) DISPLAY SUBSTRATE, DISPLAY APPARATUS, AND METHOD OF FABRICATING DISPLAY SUBSTRATE

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 208 days.

(21) Appl. No.: 16/762,985

(22) PCT Filed: Jul. 5, 2019

(86) PCT No.: PCT/CN2019/094867
§ 371 (c)(1),
(2) Date: May 11, 2020

(87) PCT Pub. No.: WO2021/003600
PCT Pub. Date: Jan. 14, 2021

(65) Prior Publication Data
US 2021/0408440 A1 Dec. 30, 2021

(51) Int. Cl.
*H01L 51/52* (2006.01)
*H01L 27/32* (2006.01)
*H01L 51/56* (2006.01)

(52) U.S. Cl.
CPC ...... *H01L 51/5228* (2013.01); *H01L 27/3246* (2013.01); *H01L 27/3276* (2013.01);
(Continued)

(58) Field of Classification Search
CPC ............... H01L 51/56; H01L 2227/323; H01L 51/5228; H01L 27/3246
See application file for complete search history.

(56) References Cited

U.S. PATENT DOCUMENTS 9,048,454 B2     6/2015  Song et al.
2018/0123078 A1*  5/2018  Byun ............ H01L 27/3246
(Continued)

FOREIGN PATENT DOCUMENTS

CN    106784375 A    5/2017
CN    107611283 A    1/2018
(Continued)

OTHER PUBLICATIONS

International Search Report & Written Opinion dated Apr. 2, 2020, regarding PCT/CN2019/094867.
(Continued)

*Primary Examiner* — Fernando L Toledo
*Assistant Examiner* — Valerie N Newton
(74) *Attorney, Agent, or Firm* — Intellectual Valley Law, P.C.

(57) ABSTRACT

A display substrate including a plurality of light emitting elements respectively in a plurality of subpixels configured to emit light for image display is provided. A respective one of the plurality of subpixels includes a base substrate; a first auxiliary cathode; a passivation layer; a first insulating layer; a second auxiliary cathode; a second insulating layer; and a pixel definition layer. The display substrate has a cathode aperture extending through the pixel definition layer and an auxiliary cathode aperture extending through the first insulating layer and the passivation layer. A cathode of a respective one of the plurality of light emitting elements extends into the cathode aperture to electrically connect with the second auxiliary cathode. The second auxiliary cathode
(Continued)

extends into the auxiliary cathode aperture to electrically connect with the first auxiliary cathode.

18 Claims, 10 Drawing Sheets

(52) U.S. Cl.
CPC .......... *H01L 51/5234* (2013.01); *H01L 51/56* (2013.01); *H01L 2227/323* (2013.01)

(56) References Cited

U.S. PATENT DOCUMENTS

| | | | |
|---|---|---|---|
| 2018/0342694 A1 | 11/2018 | Tang | |
| 2019/0189717 A1* | 6/2019 | Choi | H01L 51/5212 |
| 2019/0326370 A1* | 10/2019 | Lu | H01L 27/3276 |
| 2020/0127225 A1 | 4/2020 | Zhang et al. | |
| 2021/0233979 A1* | 7/2021 | Ma | H01L 51/5228 |

FOREIGN PATENT DOCUMENTS

| | | |
|---|---|---|
| CN | 108010935 A | 5/2018 |
| CN | 108538890 A | 9/2018 |

OTHER PUBLICATIONS

First Office Action in the Chinese Patent Application No. 201980000990.X, dated Jun. 5, 2020; English translation attached.

\* cited by examiner

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2019/094867, filed Jul. 5, 2019, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. In the top-emission type OLED, the cathode is optically transparent, while the anode is reflective.

SUMMARY

In one aspect, the present invention provides a display substrate, comprising a plurality of light emitting elements respectively in a plurality of subpixels configured to emit light for image display; wherein a respective one of the plurality of subpixels comprises a base substrate; a first auxiliary cathode on the base substrate; a passivation layer on a side of the first auxiliary cathode away from the base substrate; a first insulating layer on a side of the passivation layer away from the base substrate; a second auxiliary cathode on a side of the first insulating layer away from the base substrate; a second insulating layer on a side of the second auxiliary cathode away from the base substrate; and a pixel definition layer on a side of the second insulating layer away from the base substrate; wherein the display substrate has a cathode aperture extending through the pixel definition layer and an auxiliary cathode aperture extending through the first insulating layer and the passivation layer; a cathode of a respective one of the plurality of light emitting elements extends into the cathode aperture to electrically connect with the second auxiliary cathode; and the second auxiliary cathode extends into the auxiliary cathode aperture to electrically connect with the first auxiliary cathode.

Optionally, the cathode of a respective one of the plurality of light emitting elements is substantially outside the auxiliary cathode aperture; and the second insulating layer is substantially inside the auxiliary cathode aperture.

Optionally, an orthographic projection of the second auxiliary cathode on the base substrate substantially covers an orthographic projection of the second insulating layer on the base substrate; and the second auxiliary cathode and the second insulating layer together form a substantially flat surface.

Optionally, the cathode of the respective one of the plurality of light emitting elements is in direct contact with the second auxiliary cathode and is in direct contact with the second insulating layer; and a portion of the cathode of the respective one of the plurality of light emitting elements is on the substantially flat surface.

Optionally, a direct contacting interface between the cathode of the respective one of the plurality of light emitting elements and the second auxiliary cathode substantially surrounds a direct contacting interface between the cathode of the respective one of the plurality of light emitting elements and the second insulating layer.

Optionally, the respective one of the plurality of subpixels further comprises a third auxiliary cathode on a side of the second auxiliary cathode and the second insulating layer away from the base substrate; wherein the second insulating layer is sandwiched between the second auxiliary cathode and third auxiliary cathode; the cathode of the respective one of the plurality of light emitting elements extends into the cathode aperture to electrically connect with the second auxiliary cathode through the third auxiliary cathode; and the third auxiliary cathode is on the substantially flat surface.

Optionally, the cathode of the respective one of the plurality of light emitting elements is in direct contact with the third auxiliary cathode; and the second auxiliary cathode and the second insulating layer are spaced apart from the cathode of the respective one of the plurality of light emitting elements by the third auxiliary cathode.

Optionally, the third auxiliary cathode is in direct contact with the second auxiliary cathode and is in direct contact with the second insulating layer.

Optionally, a direct contacting interface between the third auxiliary cathode and the second auxiliary cathode substantially surrounds a direct contacting interface between the third auxiliary cathode and the second insulating layer.

Optionally, the second auxiliary cathode, the third auxiliary cathode, and the cathode of the respective one of the plurality of light emitting elements are made of a substantially transparent conductive material; and the first auxiliary cathode is made of a metallic conductive material.

Optionally, the second auxiliary cathode and the cathode of the respective one of the plurality of light emitting elements are made of a substantially transparent conductive material; and the first auxiliary cathode is made of a metallic conductive material.

Optionally, the respective one of the plurality of subpixels further comprises a thin film transistor; wherein the thin film transistor comprises a source electrode and a drain electrode; the drain electrode of the thin film transistor is electrically connected to an anode of the respective one of the plurality of light emitting elements; and the first auxiliary cathode is in a same layer and comprises a same material as the source electrode and the drain electrode of the thin film transistor.

Optionally, the first insulating layer and the second insulating layer are made of organic insulating materials.

Optionally, the first insulating layer is made of a positive photoresist material the second insulating layer is made of a negative photoresist material; or the first insulating layer is made of a negative photoresist material the second insulating layer is made of a positive photoresist material.

Optionally, the display substrate further comprises a plurality of low voltage signal lines respectively extending into the plurality of subpixels; wherein a respective one of the plurality of low voltage signal lines is electrically connected to the first auxiliary cathode.

In another aspect, the present invention provides a display apparatus, comprising the display substrate described herein or fabricated by a method described herein, and one or more integrated circuits connected to the display substrate; wherein the display substrate further comprises a plurality of low voltage signal lines respectively extending into the plurality of subpixels; and a respective one of the plurality of low voltage signal lines electrically connects the first auxiliary cathode with the one or more integrated circuits.

In another aspect, the present invention provides a method of fabricating a display substrate comprising a plurality of light emitting elements respectively in a plurality of subpixels configured to emit light for image display; wherein forming a respective one of the plurality of subpixels comprises forming a first auxiliary cathode on a base substrate; forming a passivation layer on a side of the first auxiliary cathode away from the base substrate; forming a first insulating layer on a side of the passivation layer away from the base substrate; forming a second auxiliary cathode on a side of the first insulating layer away from the base substrate; forming a second insulating layer on a side of the second auxiliary cathode away from the base substrate; and forming a pixel definition layer on a side of the second insulating layer away from the base substrate; wherein the display substrate has a cathode aperture extending through the pixel definition layer and an auxiliary cathode aperture extending through the first insulating layer and the passivation layer; a cathode of a respective one of the plurality of light emitting elements extends into the cathode aperture to electrically connect with the second auxiliary cathode; and the second auxiliary cathode extends into the auxiliary cathode aperture to electrically connect with the first auxiliary cathode.

Optionally, forming the first insulating layer comprises forming a first photoresist layer on a side of the passivation layer away from the base substrate; and exposing the first photoresist layer using a first mask plate and developing the first photoresist layer to form the auxiliary cathode aperture, thereby forming the first insulating layer, the auxiliary cathode aperture extending through the first insulating layer and the passivation layer and exposing a surface of the first auxiliary cathode; wherein forming the second insulating layer comprises forming a second photoresist layer on a side of the first insulating layer and the second auxiliary cathode away from the base substrate; and exposing the second photoresist layer using a second mask plate and developing the second photoresist layer to form the second insulating layer, wherein the second insulating layer is substantially inside the auxiliary cathode aperture; wherein the second mask plate is the same as the first mask plate; wherein the first photoresist layer is made of a positive photoresist material the second photoresist layer is made of a negative photoresist material, or the first photoresist layer is made of a negative photoresist material the second photoresist layer is made of a positive photoresist material.

Optionally, subsequent to forming the second insulating layer, the method further comprises forming the cathode of the respective one of the plurality of light emitting elements; wherein the cathode of the respective one of the plurality of light emitting elements is in direct contact with the second auxiliary cathode and is in direct contact with the second insulating layer.

Optionally, subsequent to forming the second insulating layer and prior to forming the cathode of the respective one of the plurality of light emitting elements, the method further comprises forming a third auxiliary cathode on a side of the second auxiliary cathode and the second insulating layer away from the base substrate; wherein the second insulating layer is sandwiched between the second auxiliary cathode and third auxiliary cathode; and the cathode of the respective one of the plurality of light emitting elements extends into the cathode aperture to electrically connect with the second auxiliary cathode through the third auxiliary cathode.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a self-emitting display apparatus, a cathode of a light emitting element is provided with a low voltage signal, e.g., a Vss signal. In related display apparatus, the Vss signal is provided directly to the cathode by a signal line in a peripheral region of the display apparatus. Thus, an IR drop exists across different regions of the cathode across the display panel. The IR drop leads to non-uniformity of voltage levels across various regions of the cathode, resulting in non-uniformity of display illuminance in the display panel.

The present disclosure provides, inter alia, a display substrate, a display apparatus, and a method of fabricating a display substrate that substantially obviate one or more of the problems due to limitations and disadvantages of the related art. In one aspect, the present disclosure provides a display substrate including a plurality of light emitting elements respectively in a plurality of subpixels configured to emit light for image display. In some embodiments, a respective one of the plurality of subpixels includes a base substrate; a first auxiliary cathode on the base substrate; a passivation layer on a side of the first auxiliary cathode away from the base substrate; a first insulating layer on a side of the passivation layer away from the base substrate; a second auxiliary cathode on a side of the first insulating layer away from the base substrate; a second insulating layer on a side of the second auxiliary cathode away from the base substrate; and a pixel definition layer on a side of the second insulating layer away from the base substrate. Optionally, the display substrate has a cathode aperture extending through the pixel definition layer and an auxiliary cathode aperture extending through the first insulating layer and the passivation layer. Optionally, a cathode of a respective one of the plurality of light emitting elements extends into the cathode aperture to electrically connect with the second auxiliary cathode. Optionally, the second auxiliary cathode extends into the auxiliary cathode aperture to electrically connect with the first auxiliary cathode.

Figure 1:
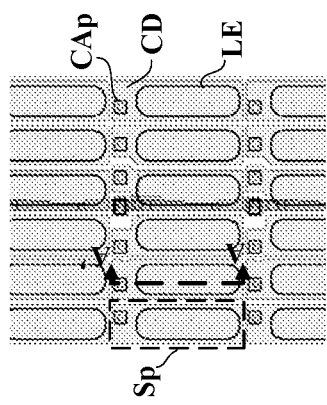
FIG. 1 is a plan view of a display substrate in some embodiments according to the present disclosure.

FIG. 1 is a plan view of a display substrate in some embodiments according to the present disclosure. Referring to FIG. 1, the display substrate in some embodiments includes a plurality of light emitting elements LE respectively in a plurality of subpixels Sp configured to emit light for image display. A respective one of the plurality of subpixels Sp includes a cathode CD. The cathode extends through a cathode aperture CAp to connect to a component (e.g., a Vss signal line) that is configured to transmit a low voltage signal (e.g., a Vss signal) to the cathode CD.

Figure 2:
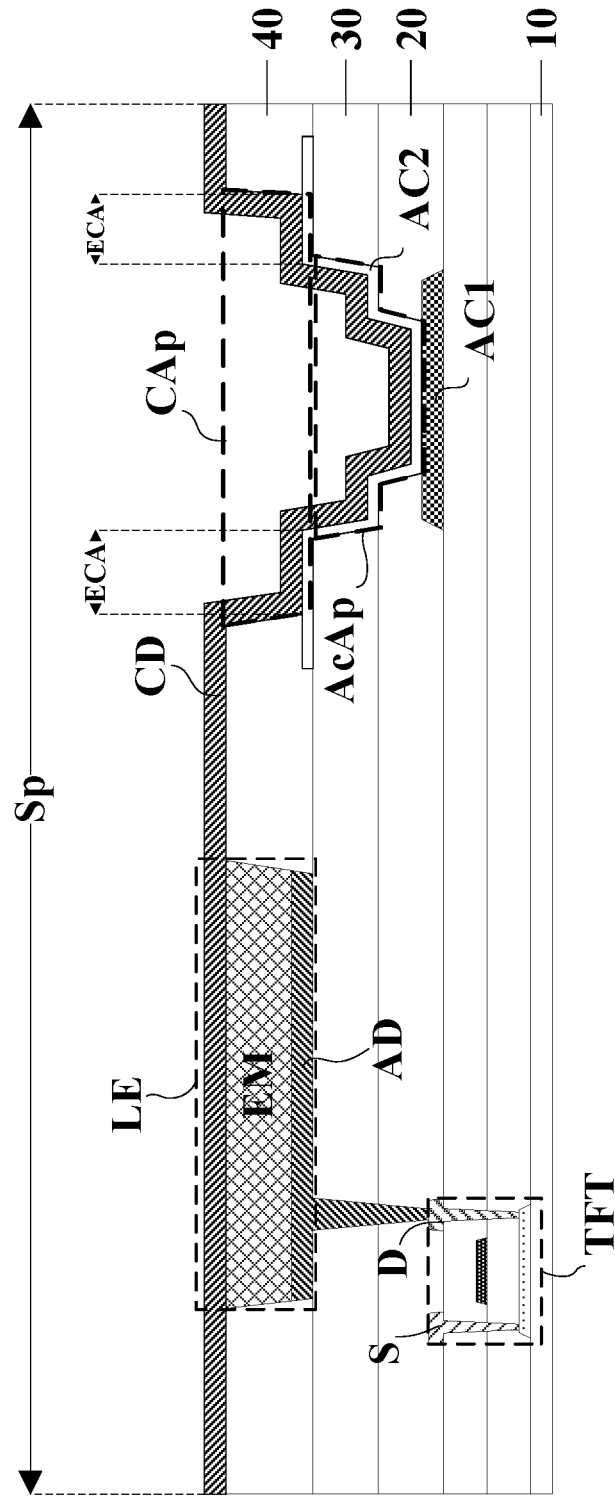
FIG. 2 is a cross-sectional view of a respective one of the plurality of subpixels of a display substrate along an A-A' line in FIG. 1.

FIG. 2 is a cross-sectional view of a respective one of the plurality of subpixels of a display substrate along an A-A' line in FIG. 1. Referring to FIG. 2, the respective one of the plurality of subpixels Sp includes a base substrate 10; a first auxiliary cathode AC1 on the base substrate 10; a passivation layer 20 on a side of the first auxiliary cathode AC1 away from the base substrate 10; a first insulating layer 30 on a side of the passivation layer 20 away from the base substrate 10; a second auxiliary cathode AC2 on a side of the first insulating layer 30 away from the base substrate 10; and a pixel definition layer 40 on a side of the first insulating layer 30 away from the base substrate 10. A respective one of the plurality of light emitting elements LE includes an anode AD on the base substrate 10; a light emitting layer EM on a side of the anode AD away from the base substrate 10; and a cathode CD on a side of the light emitting layer EM away from the base substrate 10. The display substrate has a cathode aperture CAp extending through the pixel definition layer 40 and an auxiliary cathode aperture AcAp extending through the first insulating layer 30 and the passivation layer 20, exposing a surface of the first auxiliary layer AC1. The cathode CD of the respective one of the plurality of light emitting elements LE extends into the cathode aperture CAp and the auxiliary cathode aperture AcAp to electrically connect with the second auxiliary cathode AC2. The second auxiliary cathode AC2 extends into the auxiliary cathode aperture AcAp to electrically connect with the first auxiliary cathode AC1.

It is discovered in the present disclosure, although the IR drop issue can be effectively obviated to a certain degree in a display substrate of FIG. 2, the effective contacting area ECA between the cathode CD and the second auxiliary cathode AC2 is limited. As shown in FIG. 2, the first insulating layer 30 functions at least partially as a planarization layer, thus typically is made of a relatively large thickness. The auxiliary cathode aperture AcAp is formed to extend through the first insulating layer 30 and the passivation layer 20. The cathode CD extends into the cathode aperture CAp and the auxiliary cathode aperture AcAp to connect to the second auxiliary cathode AC2. Due to the large combined thickness of the first insulating layer 30, the passivation layer 20, and the pixel definition layer 40, the cathode CD in the cathode aperture CAp and the auxiliary cathode aperture AcAp undergoes a steep elevation change over several layers. For example, as shown in FIG. 2, the cathode CD in the cathode aperture CAp and the auxiliary cathode aperture AcAp has to descend at least three steps to the bottom of the auxiliary cathode aperture AcAp, then ascend at least three steps to exit the cathode aperture CAp. As a result of not only the steep elevation change over several layers but also the rugged side surfaces of the cathode aperture CAp and the auxiliary cathode aperture AcAp, the cathode CD in the cathode aperture CAp and the auxiliary cathode aperture AcAp is easily prone to open, leading to a relatively limited effective contacting area ECA of the cathode CD. To ensure that the effective contact between the cathode CD and the second auxiliary cathode AC2 amounts to a sufficiently high level, the cathode aperture CAp has to be made relatively larger, but this will inevitably decrease the aperture ratio of the display apparatus.

Figure 3:
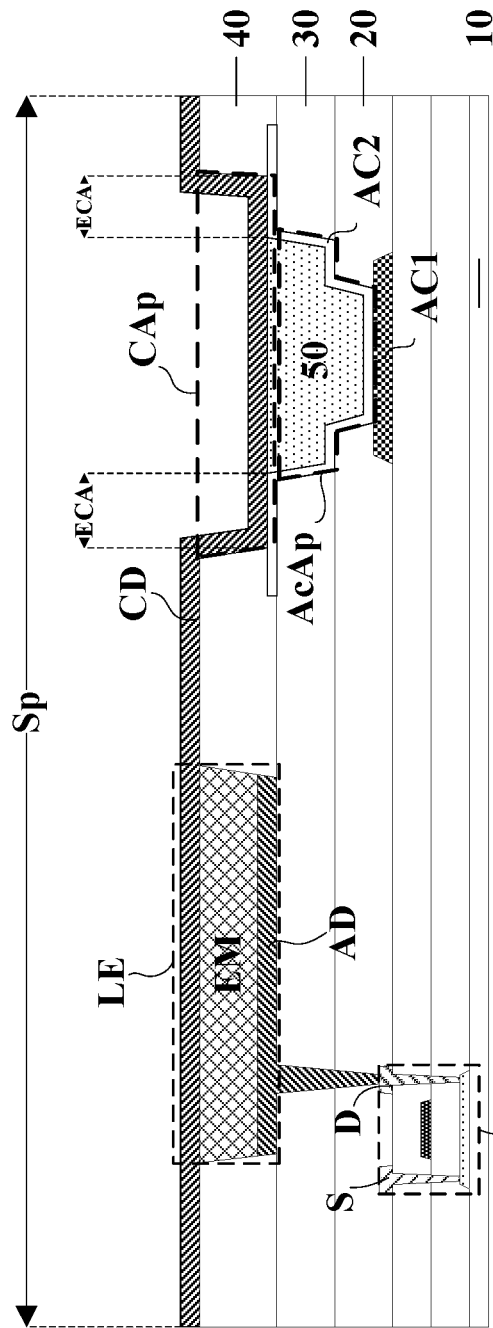
FIG. 3 is a cross-sectional view of a respective one of the plurality of subpixels of a display substrate in some embodiments according to the present disclosure.

FIG. 3 is a cross-sectional view of a respective one of the plurality of subpixels of a display substrate in some embodiments according to the present disclosure. Referring to FIG. 3, the respective one of the plurality of subpixels Sp in some embodiments includes a base substrate 10; a first auxiliary cathode AC1 on the base substrate 10; a passivation layer 20 on a side of the first auxiliary cathode AC1 away from the base substrate 10; a first insulating layer 30 on a side of the passivation layer 20 away from the base substrate 10; a second auxiliary cathode AC2 on a side of the first insulating layer 30 away from the base substrate 10; a second insulating layer 50 on a side of the second auxiliary cathode AC2 away from the base substrate 10; and a pixel definition layer 40 on a side of the second insulating layer 50 away from the base substrate 10. The display substrate has a cathode aperture CAp extending through the pixel definition layer 40 and an auxiliary cathode aperture AcAp extending through the first insulating layer 30 and the passivation layer 20 and exposing a surface of the first auxiliary cathode AC1. The cathode of a respective one of the plurality of light emitting elements LE extends into the cathode aperture CAp, to electrically connect with the second auxiliary cathode AC2. The second auxiliary cathode AC2 extends into the auxiliary cathode aperture AcAp to electrically connect with the first auxiliary cathode AC1.

As compared to that in the display substrate of FIG. 2, the cathode CD in the display substrate of FIG. 3 does not have to undergo a steep elevation change over several layers. For example, the cathode CD in the display substrate of FIG. 3 descends only one step into the cathode aperture CAp and then ascends only one step to exit the cathode aperture CAp.

As a result, the cathode CD in the cathode aperture CAp is not prone to line open. Referring to FIG. 3, the cathode CD of the respective one of the plurality of light emitting elements LE is in direct contact with the second auxiliary cathode AC2 and is in direct contact with the second insulating layer 50. The second auxiliary cathode AC2 and the second insulating layer 50 together form a substantially flat surface. The cathode CD of the respective one of the plurality of light emitting elements LE passes through the substantially flat surface without undergoing a steep elevation change.

Figure 4A:
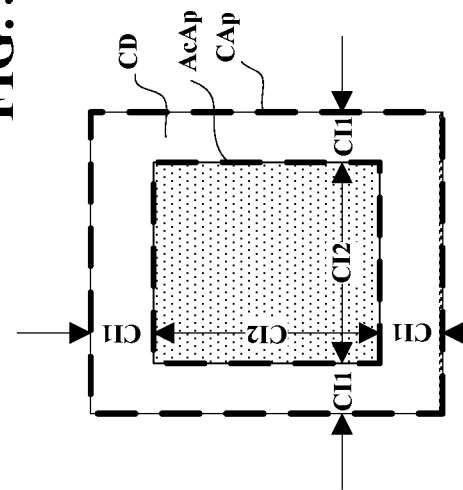
FIG. 4A is a plan view of a portion of a cathode of a respective one of the plurality of light emitting elements in a cathode aperture in a display substrate in some embodiments according to the present disclosure.

FIG. 4A is a plan view of a portion of a cathode of a respective one of the plurality of light emitting elements in a cathode aperture in a display substrate in some embodiments according to the present disclosure. Referring to FIG. 3 and FIG. 4A, a direct contacting interface CI1 between the cathode CD of the respective one of the plurality of light emitting elements LE and the second auxiliary cathode AC2 substantially surrounds a direct contacting interface CI2 between the cathode CD of the respective one of the plurality of light emitting elements LE and the second insulating layer 50. As used herein the term "substantially surrounds" refers to surrounding at least 50% (e.g., at least 60%, at least 70%, at least 80%, at least 90%, at least 95%, at least 99%, and 100%) of a perimeter of a target area. Optionally, the direct contacting interface CI1 and the direct contacting interface CI2 abut each other, forming a unitary contacting interface, as shown in FIG. 4A.

Figure 5:
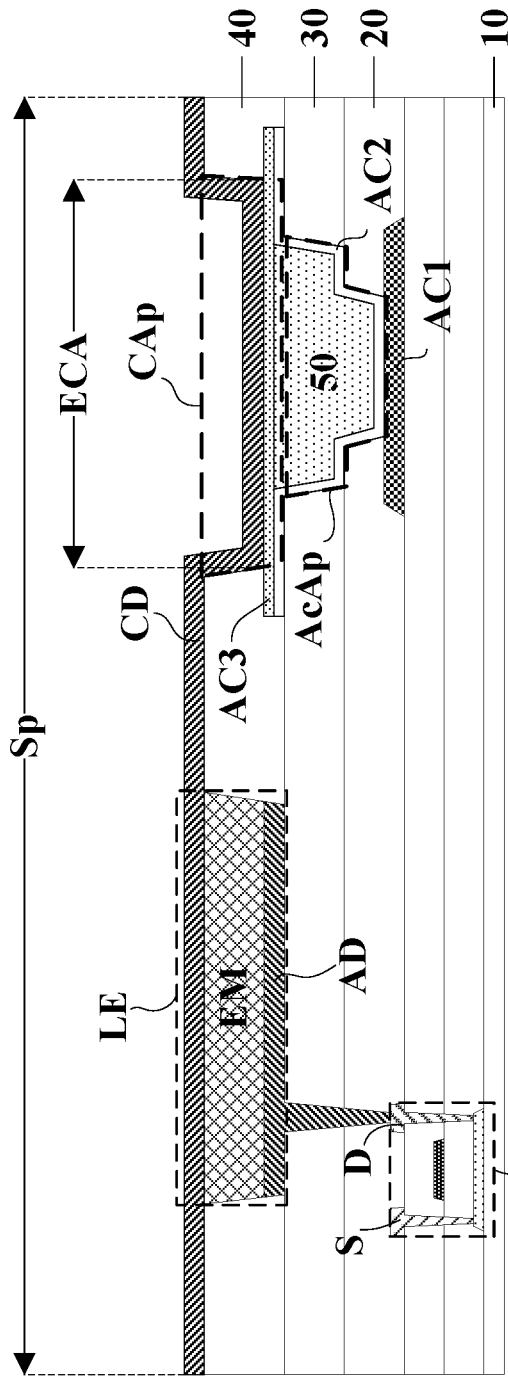
FIG. 5 is a cross-sectional view of a respective one of the plurality of subpixels of a display substrate in some embodiments according to the present disclosure.

FIG. 5 is a cross-sectional view of a respective one of the plurality of subpixels of a display substrate in some embodiments according to the present disclosure. Referring to FIG. 5, the respective one of the plurality of subpixels Sp in some embodiments includes a base substrate 10; a first auxiliary cathode AC1 on the base substrate 10; a passivation layer 20 on a side of the first auxiliary cathode AC1 away from the base substrate 10; a first insulating layer 30 on a side of the passivation layer 20 away from the base substrate 10; a second auxiliary cathode AC2 on a side of the first insulating layer 30 away from the base substrate 10; a second insulating layer 50 on a side of the second auxiliary cathode AC2 away from the base substrate 10; a third auxiliary cathode AC3 on a side of the second auxiliary cathode AC2 and the second insulating layer 50 away from the base substrate 10; and a pixel definition layer 40 on a side of the second insulating layer 50 away from the base substrate 10. The second insulating layer 50 is sandwiched between the second auxiliary cathode AC2 and third auxiliary cathode AC3.

Referring to FIG. 5, the display substrate has a cathode aperture CAp extending through the pixel definition layer 40 and an auxiliary cathode aperture AcAp extending through the first insulating layer 30 and the passivation layer 20 and exposing a surface of the first auxiliary cathode AC1. The cathode CD of the respective one of the plurality of light emitting elements LE extends into the cathode aperture CAp to electrically connect with the second auxiliary cathode AC2 through the third auxiliary cathode AC3. The second auxiliary cathode AC2 extends into the auxiliary cathode aperture AcAp to electrically connect with the first auxiliary cathode AC1. In some embodiments, the cathode CD of the respective one of the plurality of light emitting elements LE is not in direct contact with the second auxiliary cathode AC2 and is not in direct contact with the second insulating layer 50. The second auxiliary cathode AC2 and the second insulating layer 50 are spaced apart from the cathode CD of the respective one of the plurality of light emitting elements LE by the third auxiliary cathode AC3.

In some embodiments, the cathode CD of the respective one of the plurality of light emitting elements LE is in direct contact with the third auxiliary cathode AC3. As shown in FIG. 5, in some embodiments, the second auxiliary cathode AC2 and the second insulating layer 50 together form a substantially flat surface, and the third auxiliary cathode AC3 is formed on the substantially flat surface. In turn, the portion of the cathode CD of the respective one of the plurality of light emitting elements LE in the cathode aperture CAp is formed on a substantially flat surface of the third auxiliary cathode AC3. As used herein, the term "substantially flat surface" may include small deviations from flat surface geometries, for example, deviations due to manufacturing processes.

As compared to that in the display substrate of FIG. 2, the cathode CD in the display substrate of FIG. 5 does not have to undergo a steep elevation change over several layers. For example, the cathode CD in the display substrate of FIG. 5 descends only one step into the cathode aperture CAp and then ascends only one step to exit the cathode aperture CAp. As a result, the cathode CD in the cathode aperture CAp is not prone to line open. As compared to that in the display substrate of FIG. 3, the portion of the cathode CD in the cathode aperture CAp of the display substrate of FIG. 5 is exclusively in direct contact with the third auxiliary cathode AC3, as a result, the effective contacting area ECA of the cathode CD is much greater. For example, the effective contacting area ECA of the cathode CD is substantially the same as the aperture area of the cathode aperture CAp. As used herein, the term "substantially the same" refers to a difference between two values not exceeding 30% of a base value (e.g., one of the two values), e.g., not exceeding 25%, not exceeding 20%, not exceeding 15%, not exceeding 10%, not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Figure 6B:
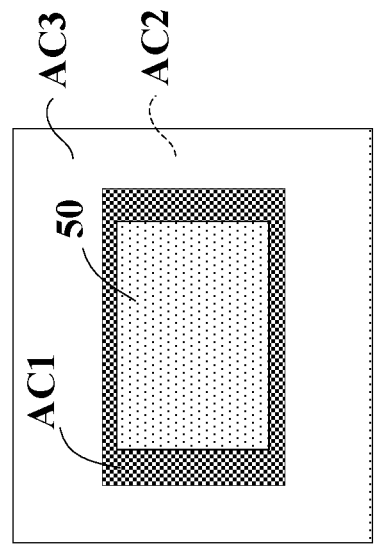
FIG. 6B is a plan view of a first auxiliary cathode, a second auxiliary cathode, a third auxiliary cathode, and a second insulating layer in a display substrate in some embodiments according to the present disclosure.
Figure 6A:
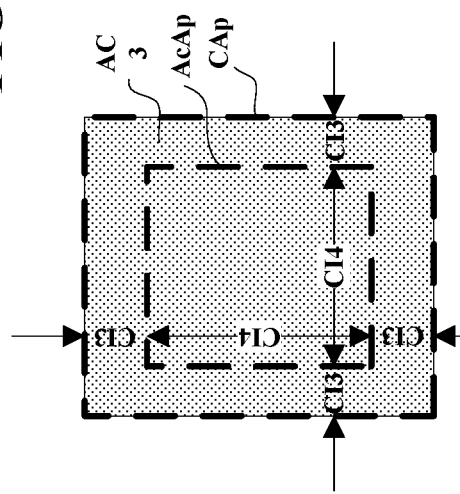
FIG. 6A is a plan view of a third auxiliary cathode in a display substrate in some embodiments according to the present disclosure.

In some embodiments, the third auxiliary cathode AC3 is in direct contact with the second auxiliary cathode AC2 and is in direct contact with the second insulating layer 50. FIG. 6A is a plan view of a third auxiliary cathode in a display substrate in some embodiments according to the present disclosure. Referring to FIG. 6A, a direct contacting interface CI3 between the third auxiliary cathode AC3 and the second auxiliary cathode AC2 substantially surrounds a direct contacting interface CI4 between the third auxiliary cathode AC3 and the second insulating layer 50. Optionally, the direct contacting interface CI3 and the direct contacting interface CI4 abut each other, forming a unitary contacting interface, as shown in FIG. 6A.

Referring to FIG. 3 and FIG. 5, in some embodiments, the cathode CD of a respective one of the plurality of light emitting elements LE is substantially outside the auxiliary cathode aperture AcAp. In some embodiments, the second insulating layer 50 is substantially inside the auxiliary cathode aperture AcAp. As used herein, the term "substantially outside" refers to at least 70% outside, e.g., at least 75% outside, at least 80% outside, at least 85% outside, at least 90% outside, at least 95% outside, at least 99% outside, or completely outside, a target space. As used herein, the term "substantially inside" refers to at least 70% inside, e.g., at least 75% inside, at least 80% inside, at least 85% inside, at least 90% inside, at least 95% inside, at least 99% inside, or completely inside, a target space.

Figure 4B:
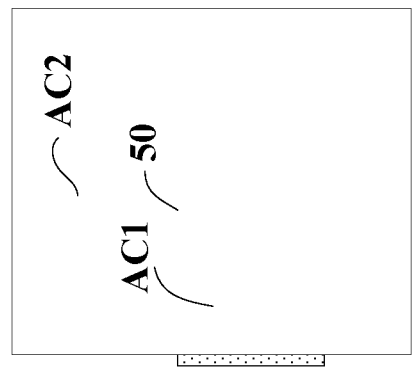
FIG. 4B is a plan view of a first auxiliary cathode, a second auxiliary cathode, and a second insulating layer in a display substrate in some embodiments according to the present disclosure.

FIG. 4B is a plan view of a first auxiliary cathode, a second auxiliary cathode, and a second insulating layer in a display substrate in some embodiments according to the present disclosure. FIG. 6B is a plan view of a first auxiliary cathode, a second auxiliary cathode, a third auxiliary cathode, and a second insulating layer in a display substrate in some embodiments according to the present disclosure. Referring to FIG. 3, FIG. 5, FIG. 4B, and FIG. 6B, in some embodiments, an orthographic projection of the second auxiliary cathode AC2 on the base substrate 10 substantially covers an orthographic projection of the second insulating layer 50 on the base substrate 10. Referring to FIG. 5 and FIG. 6B, in some embodiments, an orthographic projection of the third auxiliary cathode AC3 on the base substrate 10 substantially covers the orthographic projection of the second insulating layer 50 on the base substrate 10. As used herein, the term "substantially covers" refers to one orthographic projection being at least 50%, at least 60%, at least 70%, at least 80%, at least 90%, at least 95%, at least 99%, or 100% covered by another orthographic projection. Optionally, the orthographic projection of the second auxiliary cathode AC2 on the base substrate 10 and the orthographic projection of the third auxiliary cathode AC3 on the base substrate 10 substantially overlap with each other. As used herein, the term "substantially overlap" refers to two orthographic projections at least 50%, e.g., at least 60%, at least 70%, at least 80%, at least 90%, at least 95%, at least 99%, overlapping with each other.

Referring to FIG. 3, FIG. 5, FIG. 4B, and FIG. 6B, in some embodiments, an orthographic projection of the second auxiliary cathode AC2 on the base substrate 10 substantially covers an orthographic projection of the first auxiliary cathode AC1 on the base substrate 10. Referring to FIG. 5, in some embodiments, an orthographic projection of the third auxiliary cathode AC3 on the base substrate 10 substantially covers the orthographic projection of the first auxiliary cathode AC1 on the base substrate 10.

Referring to FIG. 3, FIG. 5, FIG. 4B, and FIG. 6B, in some embodiments, an orthographic projection of the second insulating layer 50 on the base substrate 10 substantially covers an orthographic projection of the first auxiliary cathode AC1 on the base substrate 10.

Referring to FIG. 3 and FIG. 4B, in some embodiments, the orthographic projection of the second insulating layer 50 on the base substrate 10 substantially covers the orthographic projection of the first auxiliary cathode AC1 on the base substrate 10.

Referring to FIG. 5 and FIG. 6B, in some embodiments, the orthographic projection of the first auxiliary cathode AC1 on the base substrate 10 substantially covers the orthographic projection of the second insulating layer 50 on the base substrate 10.

The cathode aperture area CAp, the auxiliary cathode aperture area AcAp, the first auxiliary cathode AC1, the second auxiliary cathode AC2, the third auxiliary cathode AC3, in some embodiments, are in an inter-subpixel region of the display substrate, whereas the respective one of the plurality of subpixels Sp is in a subpixel region of the display substrate. As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Referring to FIG. 2, FIG. 3, and FIG. 5, in some embodiments, the respective one of the plurality of subpixels further includes a thin film transistor TFT. The thin film transistor TFT includes a source electrode S and a drain electrode D. The drain electrode D of the thin film transistor TFT is electrically connected to an anode AD of the respective one of the plurality of light emitting elements LE. In some embodiments, the first auxiliary cathode AC1 is in a same layer and includes a same material as the source electrode S and the drain electrode D of the thin film transistor TFT.

Figure 7:
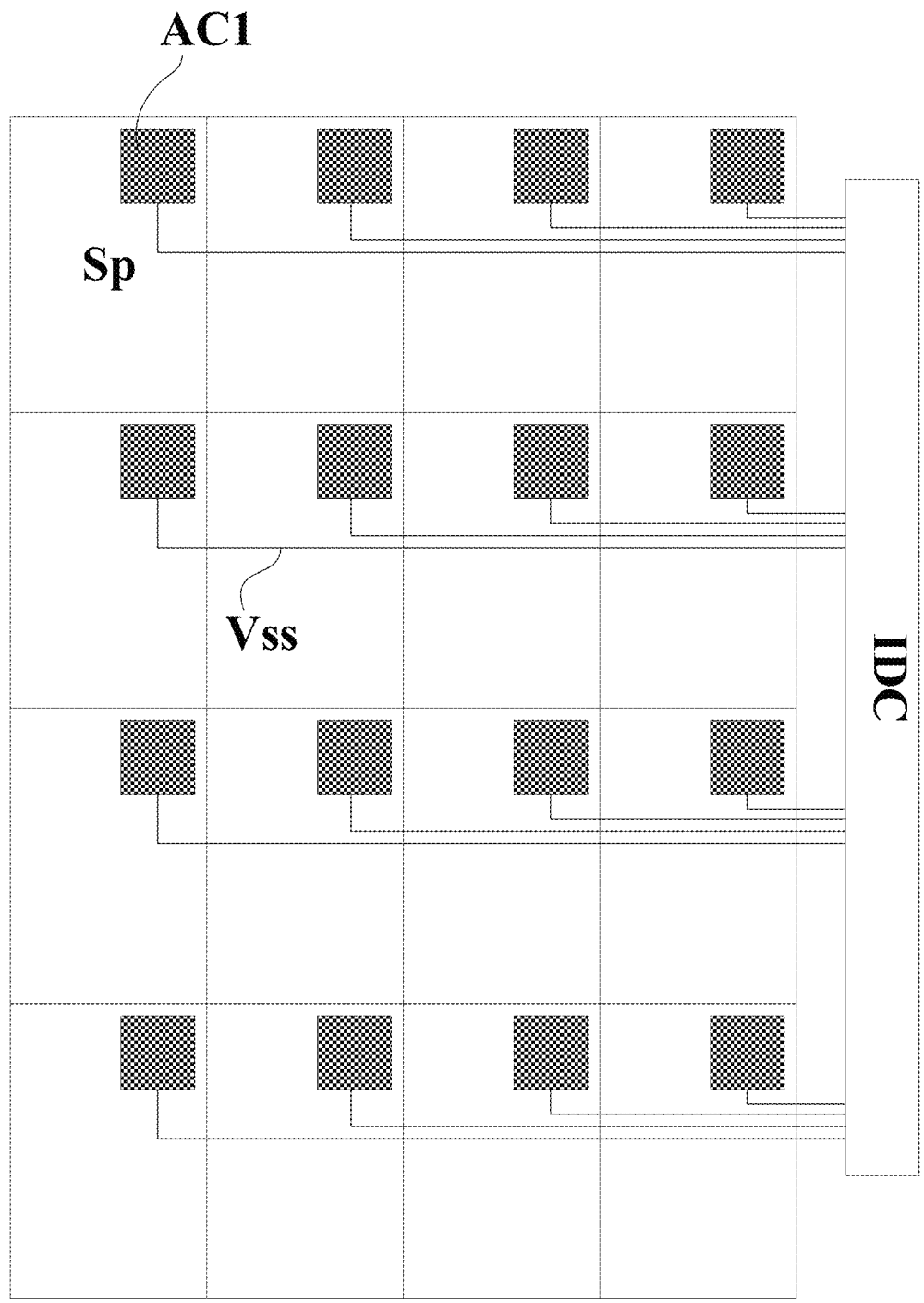
FIG. 7 is a schematic diagram illustrating the structure of a display substrate in some embodiments according to the present disclosure.

FIG. 7 is a schematic diagram illustrating the structure of a display substrate in some embodiments according to the present disclosure. Referring to FIG. 7, the display substrate in some embodiments has a plurality of subpixels Sp. The display substrate includes a plurality of first auxiliary cathodes AC1 respectively in the plurality of subpixels Sp. In some embodiments, the display substrate further includes a plurality of low voltage signal lines Vss respectively extending into the plurality of subpixels Sp. Optionally, a respective one of the plurality of low voltage signal lines Vss is electrically connected to the first auxiliary cathode AC1. The respective one of the plurality of low voltage signal lines Vss is configured to provide a low voltage to the plurality of first auxiliary cathodes AC1.

In a display apparatus having the display substrate, the respective one of the plurality of low voltage signal lines Vss connects the first auxiliary cathode AC1 to a driver circuit IDC, which is configured to provide the low voltage to the respective one of the plurality of low voltage signal lines Vss.

Various appropriate light emitting elements may be used in the present display substrate. Examples of appropriate light emitting elements include organic light emitting diodes, quantum dots light emitting diodes, and micro light emitting diodes. Optionally, the light emitting layer EM includes an organic light emitting layer. Various appropriate materials and various appropriate fabricating methods may be used to make the organic light emitting layer. For example, an organic light emitting material may be deposited by a plasma-enhanced chemical vapor deposition (PECVD) process or a coating process. Optionally, the organic light emitting layer may have a single layer structure. Optionally, the organic light emitting layer has a multi-layer structure and including multiple sub-layers.

Various appropriate electrode materials and various appropriate fabricating methods may be used for making the first auxiliary electrode AC1. For example, an electrode material may be deposited on the substrate (e.g., by sputtering, vapor deposition, solution coating, or spin coating);

and patterned (e.g., by lithography such as a wet etching process) to form the first auxiliary electrode AC1. Examples of appropriate electrode materials for making the first auxiliary electrode AC1 include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the first auxiliary electrode AC1 is made of a metallic material.

Various appropriate materials and various appropriate fabricating methods may be used to make the anode AD. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the anode AD include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the anode AD is made of an oxide semiconductor material.

Various appropriate materials and various appropriate fabricating methods may be used to make the second auxiliary electrode AC2. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the second auxiliary electrode AC2 include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the second auxiliary electrode AC2 is made of a substantially transparent conductive material such as an oxide semiconductor material. As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

Optionally, the second auxiliary electrode AC2 and the anode AD are in a same layer and includes a same material.

Various appropriate materials and various appropriate fabricating methods may be used to make the third auxiliary electrode AC3. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the third auxiliary electrode AC3 include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the third auxiliary electrode AC3 is made of a substantially transparent conductive material such as an oxide semiconductor material.

Various appropriate materials and various appropriate fabricating methods may be used to make the cathode CD. For example, a conductive material may be deposited by a plasma-enhanced chemical vapor deposition (PECVD) process or a sputtering process, e.g., a magnetron sputtering process. The deposited conductive material layer is then patterned, e.g., by a lithographic process. Examples of appropriate conductive materials for making the cathode CD include, but are not limited to, various metal materials such as molybdenum, aluminum, silver, chromium, tungsten, titanium, tantalum, copper, and alloys or laminates containing the same; and various conductive metal oxides such as indium tin oxide. Optionally, the cathode CD is made of a substantially transparent conductive material such as an oxide semiconductor material.

Optionally, and referring to FIG. 2, FIG. 3, and FIG. 5, the second auxiliary cathode AC2 and the cathode CD of the respective one of the plurality of light emitting elements LE are made of a substantially transparent conductive material; and the first auxiliary cathode AC1 is made of a metallic conductive material.

Optionally, and referring to FIG. 5, the second auxiliary cathode AC2, the third auxiliary cathode AC3, and the cathode CD of the respective one of the plurality of light emitting elements LE are made of a substantially transparent conductive material; and the first auxiliary cathode AC1 is made of a metallic conductive material.

Various appropriate insulating materials and various appropriate fabricating methods may be used to make the passivation layer 20. For example, an insulating material may be deposited on the substrate by a plasma-enhanced chemical vapor deposition (PECVD) process. Examples of appropriate insulating materials for making the passivation layer 20 include, but are not limited to, silicon oxide ($SiO_y$), silicon nitride ($SiN_y$, e.g., $Si_3N_4$), silicon oxynitride ($SiO_xN_y$), a resin, and polyimide.

Various appropriate insulating materials and various appropriate fabricating methods may be used to make the pixel definition layer 40. For example, an insulating material may be deposited on the substrate by a plasma-enhanced chemical vapor deposition (PECVD) process. Examples of appropriate insulating materials for making the pixel definition layer 40 include, but are not limited to, silicon oxide ($SiO_y$), silicon nitride ($SiN_y$, e.g., $Si_3N_4$), silicon oxynitride ($SiO_xN_y$), a resin, a photoresist material, and polyimide.

Various appropriate insulating materials and various appropriate fabricating methods may be used to make the first insulating layer 30 and the second insulating layer 50. For example, an insulating material may be deposited on the substrate by a plasma-enhanced chemical vapor deposition (PECVD) process. Examples of appropriate insulating materials for making the first insulating layer 30 and the second insulating layer 50 include, but are not limited to, silicon oxide ($SiO_y$), silicon nitride ($SiN_y$, e.g., $Si_3Nd_4$), silicon oxynitride ($SiO_xN_y$), and various organic polymers such as a resin, a photoresist material, and polyimide.

In some embodiments, the first insulating layer 30 is made of a positive photoresist material the second insulating layer 50 is made of a negative photoresist material. In some embodiments, the first insulating layer 30 is made of a negative photoresist material the second insulating layer 50 is made of a positive photoresist material.

In another aspect, the present disclosure provides a method of fabricating a display substrate including a plurality of light emitting elements respectively in a plurality of subpixels configured to emit light for image display. In some embodiments, forming a respective one of the plurality of subpixels includes forming a first auxiliary cathode on a base substrate; forming a passivation layer on a side of the first auxiliary cathode away from the base substrate; forming a first insulating layer on a side of the passivation layer away from the base substrate; forming a second auxiliary cathode on a side of the first insulating layer away from the base substrate; forming a second insulating layer on a side of the second auxiliary cathode away from the base substrate; and forming a pixel definition layer on a side of the second insulating layer away from the base substrate. Optionally, the display substrate has a cathode aperture extending through the pixel definition layer and an auxiliary cathode aperture extending through the first insulating layer and the passivation layer. Optionally, a cathode of a respective one of the plurality of light emitting elements extends into the cathode aperture to electrically connect with the second auxiliary cathode. Optionally, the second auxiliary cathode extends into the auxiliary cathode aperture to electrically connect with the first auxiliary cathode.

In some embodiments, forming the first insulating layer includes forming a first photoresist layer on a side of the passivation layer away from the base substrate; and exposing the first photoresist layer using a first mask plate and developing the first photoresist layer to form the auxiliary cathode aperture, thereby forming the first insulating layer, the auxiliary cathode aperture extending through the first insulating layer and the passivation layer and exposing a surface of the first auxiliary cathode.

In some embodiments, forming the second insulating layer includes forming a second photoresist layer on a side of the first insulating layer and the second auxiliary cathode away from the base substrate; and exposing the second photoresist layer using a second mask plate and developing the second photoresist layer to form the second insulating layer, wherein the second insulating layer is substantially inside the auxiliary cathode aperture.

In some embodiments, a same mask plate may be used for forming the first insulating layer and for forming the second insulating layer. For example, the second mask plate is the same as the first mask plate. Optionally, the first photoresist layer is made of a positive photoresist material the second photoresist layer is made of a negative photoresist material. Optionally, the first photoresist layer is made of a negative photoresist material the second photoresist layer is made of a positive photoresist material.

In some embodiments, subsequent to forming the second insulating layer, the method further includes forming the cathode of the respective one of the plurality of light emitting elements. Optionally, the cathode of the respective one of the plurality of light emitting elements is formed to be in direct contact with the second auxiliary cathode and is in direct contact with the second insulating layer.

In some embodiments, subsequent to forming the second insulating layer and prior to forming the cathode of the respective one of the plurality of light emitting elements, the method further includes forming a third auxiliary cathode on a side of the second auxiliary cathode and the second insulating layer away from the base substrate. Optionally, the second insulating layer is formed to be sandwiched between the second auxiliary cathode and third auxiliary cathode. Optionally, the cathode of the respective one of the plurality of light emitting elements is formed to extend into the cathode aperture to electrically connect with the second auxiliary cathode through the third auxiliary cathode.

Figure 8A:
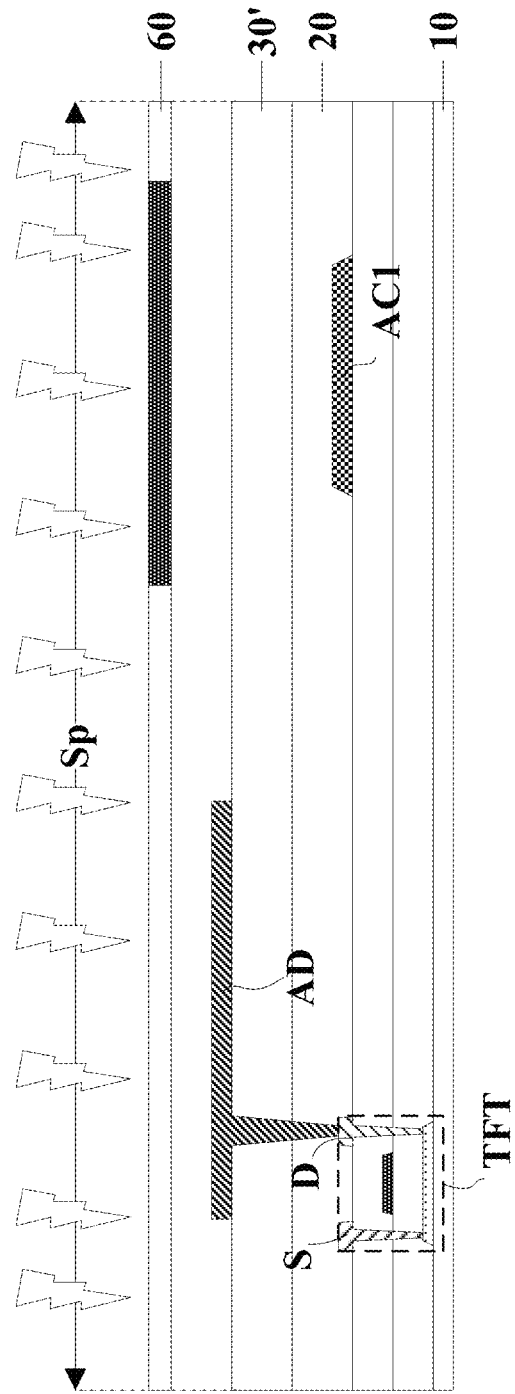
FIGS. 8A to 8F illustrate a method of fabricating a display substrate in some embodiments according to the present disclosure.

FIGS. 8A to 8F illustrate a method of fabricating a display substrate in some embodiments according to the present disclosure. Referring to FIG. 8A, a first photoresist layer 30' is formed on a side of the passivation layer 20 away from the base substrate 10. A mask plate 60 is used for exposing the first photoresist layer 30'.

Figure 8B:
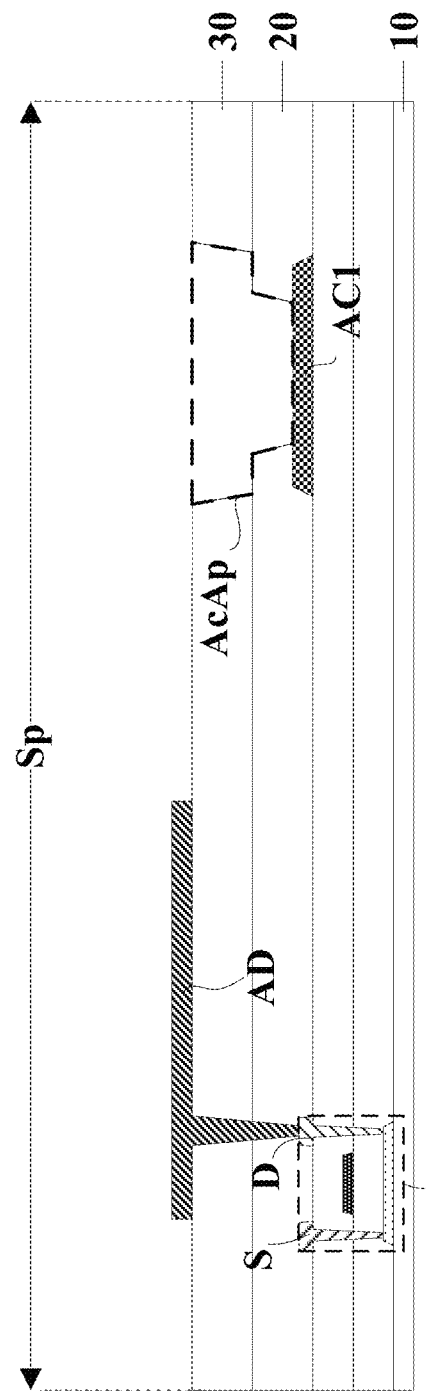

Referring to FIG. 8A and FIG. 8B, the first photoresist layer 30' is developed to form the auxiliary cathode aperture AcAp, thereby forming the first insulating layer 30. The auxiliary cathode aperture AcAp extends through the first insulating layer 30 and the passivation layer 20, exposing a surface of the first auxiliary cathode AC1.

Figure 8C:
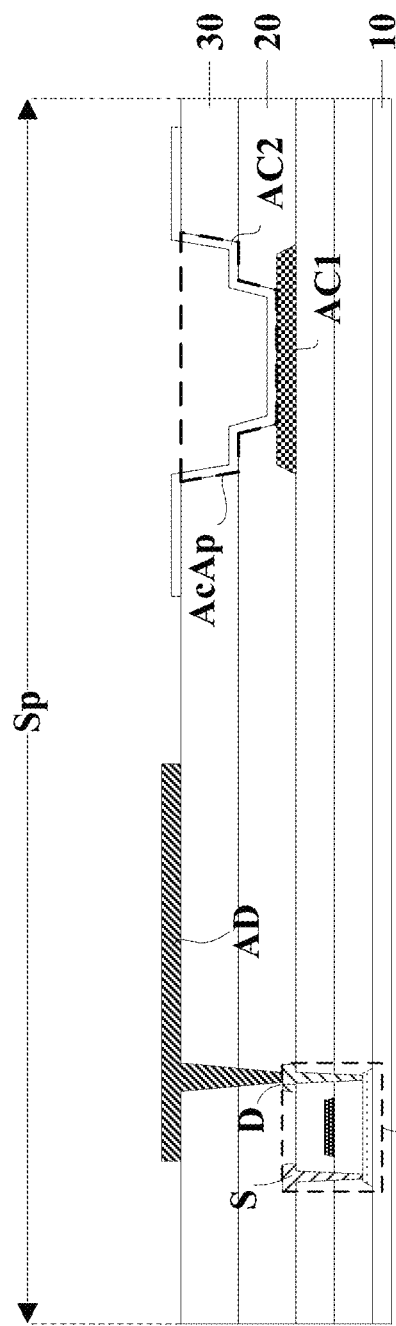

Referring to FIG. 8C, a second auxiliary cathode AC2 is formed on a side of the first insulating layer 30 away from the base substrate 10. The second auxiliary cathode AC2 extends into the auxiliary cathode aperture AcAp, e.g., substantially covering a bottom side and a lateral side of the auxiliary cathode aperture AcAp.

Figure 8D:
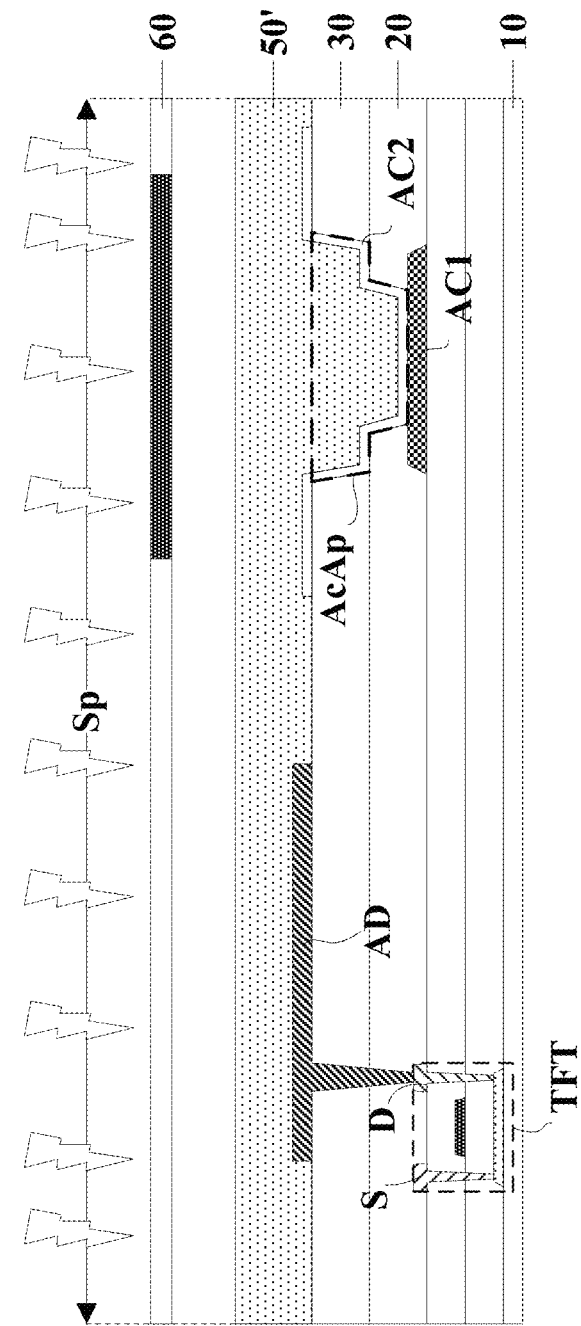

Referring to FIG. 8D, a second photoresist layer 50' is formed on a side of the first insulating layer 30 and the second auxiliary cathode AC2 away from the base substrate 10. As shown in FIG. 8D, the mask plate 60, the same mask plate used for forming the first insulating layer 30, is used again for exposing the second photoresist layer 50'.

Figure 8E:
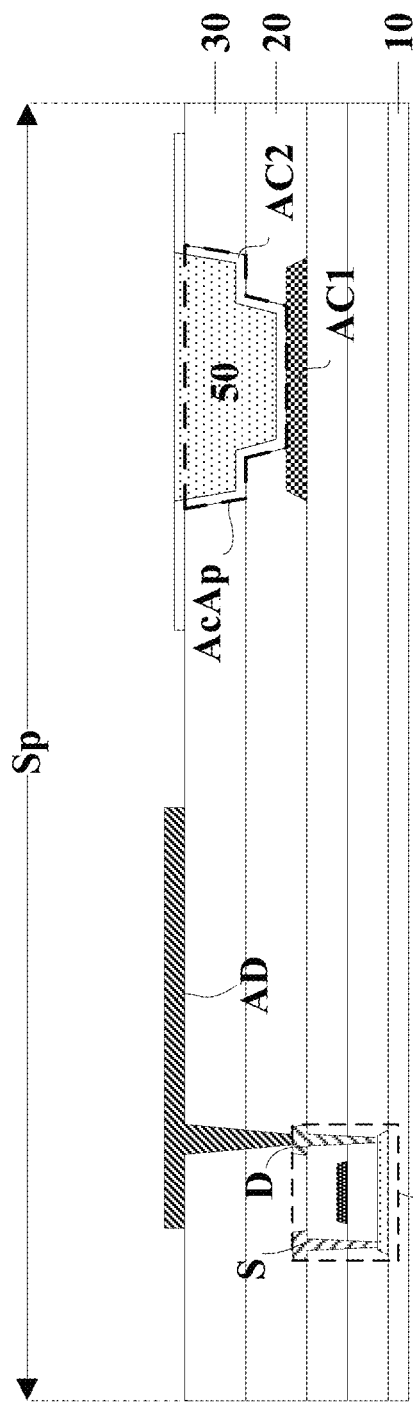

Referring to FIG. 8D and FIG. 8E, the second photoresist layer 50' is then developed to form the second insulating layer 50. The second insulating layer 50 is formed to be substantially inside the auxiliary cathode aperture AcAp. Optionally, the first photoresist layer 30' is made of a positive photoresist material the second photoresist layer 50' is made of a negative photoresist material. Optionally, the first photoresist layer 30' is made of a negative photoresist material the second photoresist layer 50' is made of a positive photoresist material.

Figure 8F:
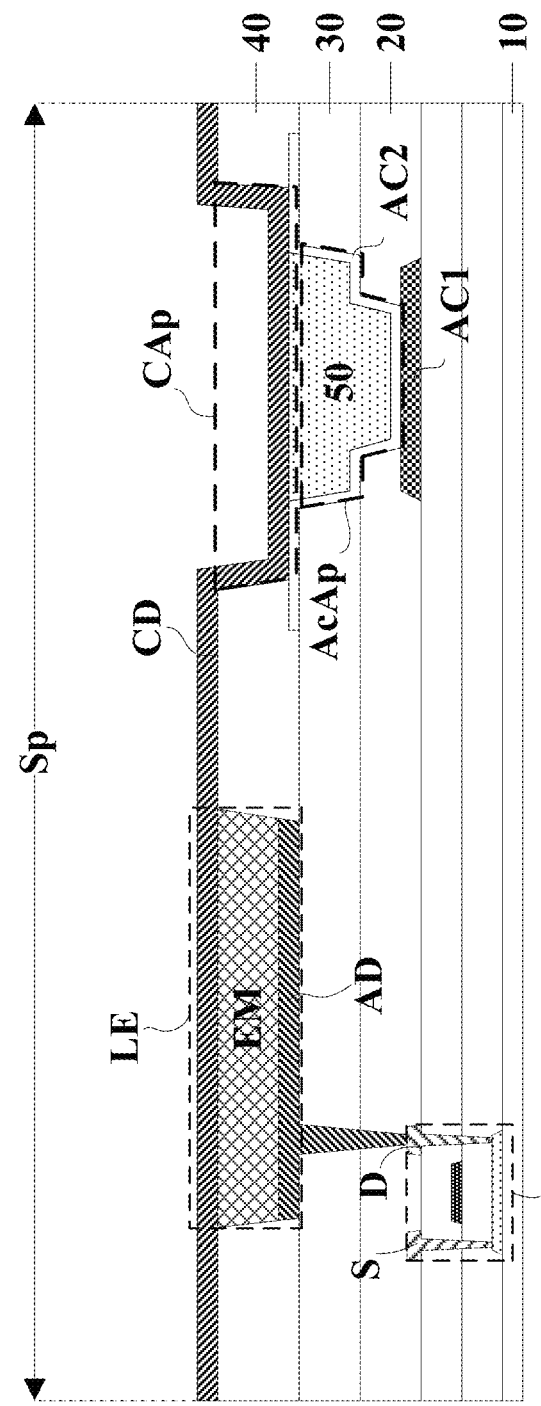

Referring to FIG. 8F, a pixel definition layer 40 is formed on a side of the second auxiliary cathode AC2 and the second insulating layer 50 away from the base substrate 10. The pixel definition layer 40 is formed to have a cathode aperture CAp extending there-through. A cathode CD is formed on a side of the pixel definition layer 40, the second insulating layer 50, and the second auxiliary cathode AC2 away from the base substrate 10. The cathode CD is formed to extend into the cathode aperture CAp, and covers a surface of the second insulating layer 50, and a surface of the second auxiliary cathode AC2.

Figure 9A:
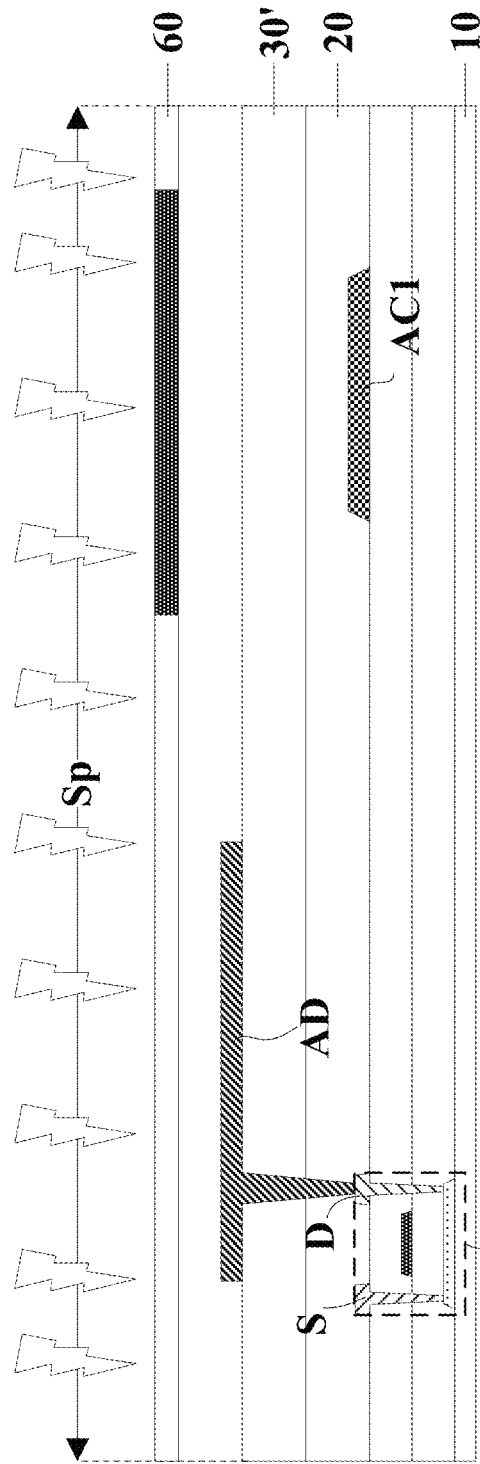
FIGS. 9A to 9G illustrate a method of fabricating a display substrate in some embodiments according to the present disclosure.

FIGS. 9A to 9G illustrate a method of fabricating a display substrate in some embodiments according to the present disclosure. Referring to FIG. 9A, a first photoresist layer 30' is formed on a side of the passivation layer 20 away from the base substrate 10. A mask plate 60 is used for exposing the first photoresist layer 30'.

Figure 9B:
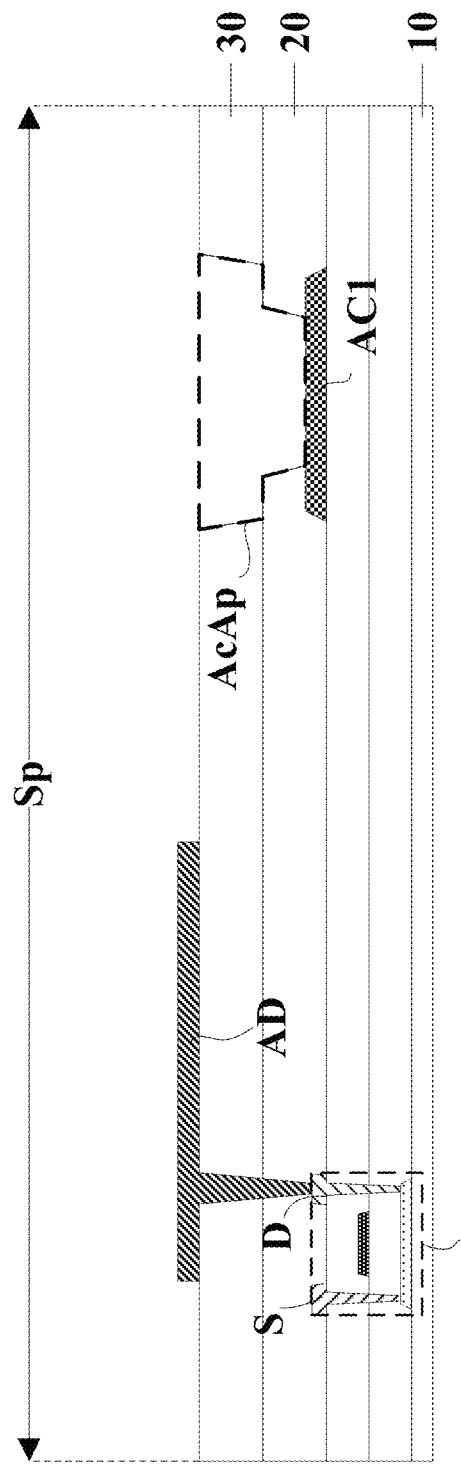

Referring to FIG. 9A and FIG. 9B, the first photoresist layer 30' is developed to form the auxiliary cathode aperture AcAp, thereby forming the first insulating layer 30. The auxiliary cathode aperture AcAp extends through the first insulating layer 30 and the passivation layer 20, exposing a surface of the first auxiliary cathode AC1.

Figure 9C:
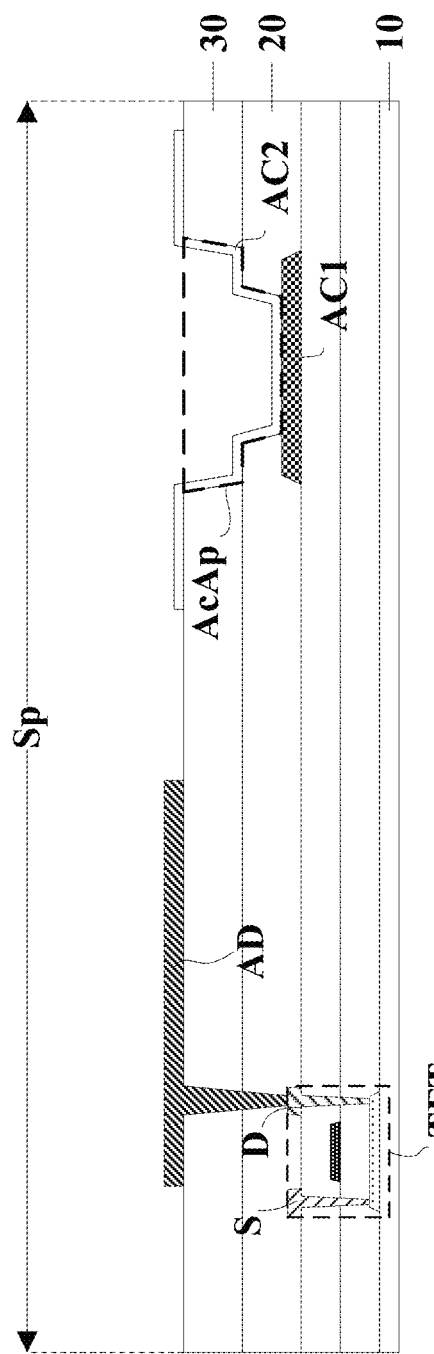

Referring to FIG. 9C, a second auxiliary cathode AC2 is formed on a side of the first insulating layer 30 away from the base substrate 10. The second auxiliary cathode AC2 extends into the auxiliary cathode aperture AcAp, e.g., substantially covering a bottom side and a lateral side of the auxiliary cathode aperture AcAp.

Figure 9D:
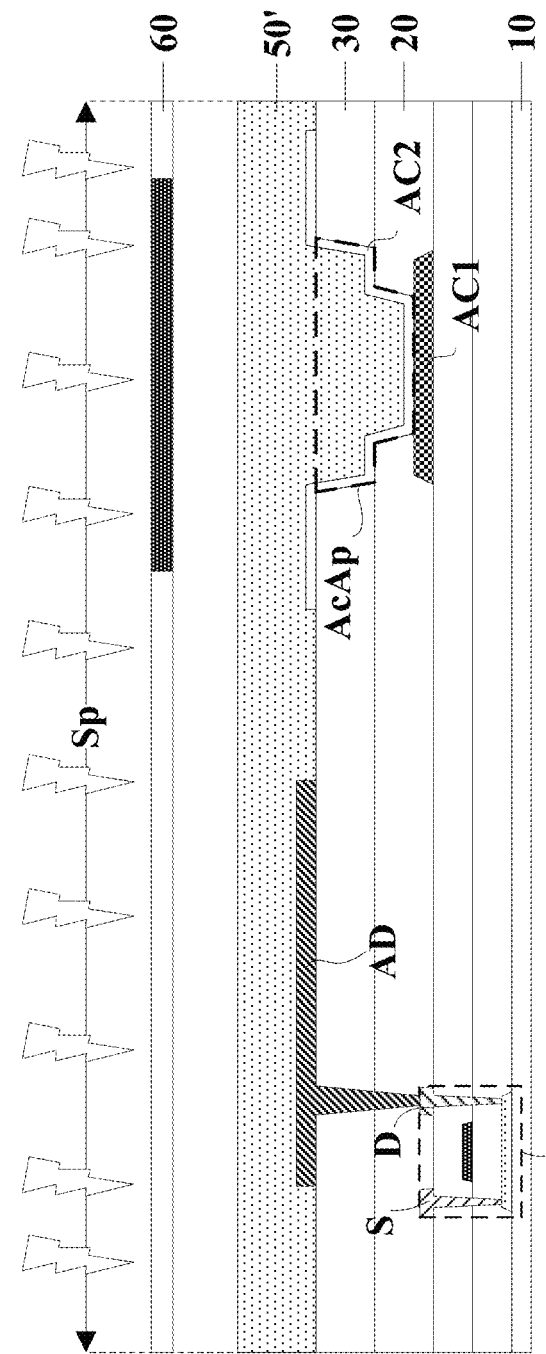

Referring to FIG. 9D, a second photoresist layer 50' is formed on a side of the first insulating layer 30 and the second auxiliary cathode AC2 away from the base substrate 10. As shown in FIG. 9D, the mask plate 60, the same mask plate used for forming the first insulating layer 30, is used again for exposing the second photoresist layer 50'.

Figure 9E:
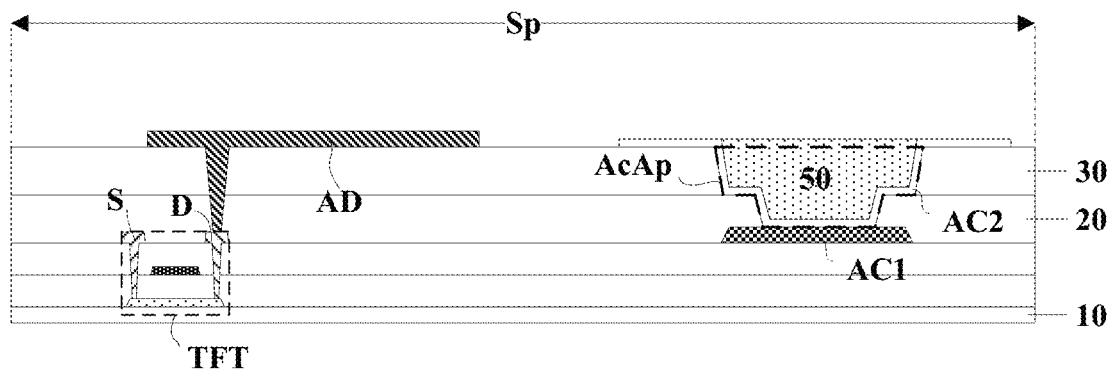

Referring to FIG. 9D and FIG. 9E, the second photoresist layer 50' is then developed to form the second insulating layer 50. The second insulating layer 50 is formed to be substantially inside the auxiliary cathode aperture AcAp. Optionally, the first photoresist layer 30' is made of a positive photoresist material the second photoresist layer 50' is made of a negative photoresist material. Optionally, the first photoresist layer 30' is made of a negative photoresist material the second photoresist layer 50' is made of a positive photoresist material.

Figure 9F:
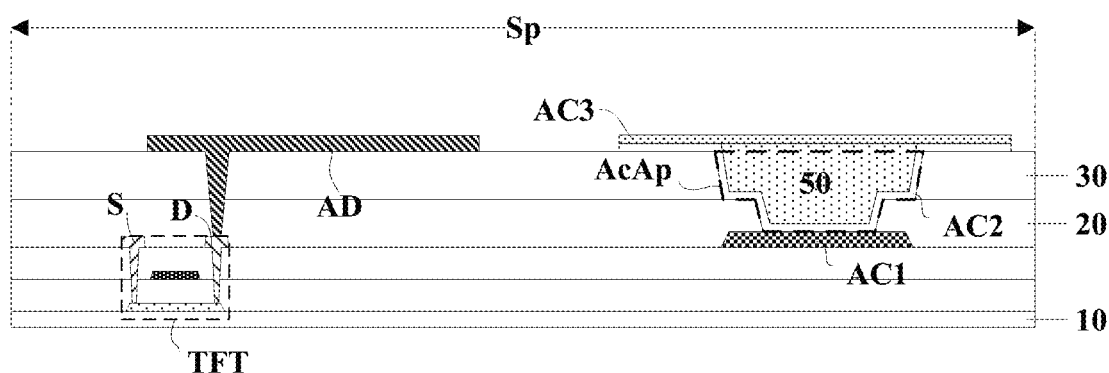

Referring to FIG. 9F, a third auxiliary cathode AC3 is formed on a side of the second auxiliary cathode AC2 and the second insulating layer 50 away from the base substrate 10.

Figure 9G:
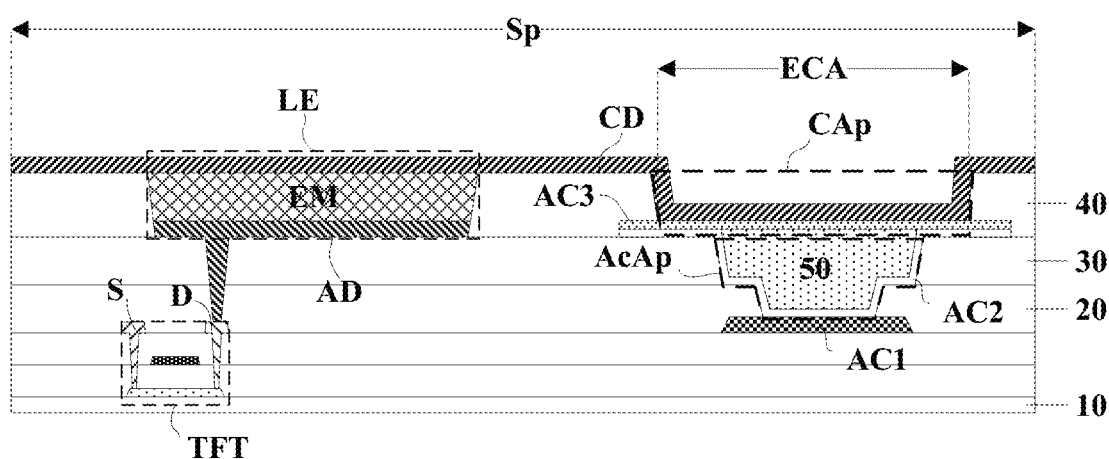

Referring to FIG. 9G, a pixel definition layer 40 is formed on a side of the third auxiliary cathode AC3 away from the base substrate 10. The pixel definition layer 40 is formed to have a cathode aperture CAp extending there-through. A cathode CD is formed on a side of the pixel definition layer 40 and the third auxiliary cathode AC3 away from the base substrate 10. The cathode CD is formed to extend into the cathode aperture CAp, and covers a surface of the third auxiliary cathode AC3.

In another aspect, the present disclosure provides a display apparatus including a display substrate described herein or fabricated by a method described herein, and one or more integrated circuits connected to the display substrate. Optionally, the display apparatus includes a display panel. Optionally, the display panel includes the display substrate described herein or fabricated by a method described herein, and a counter substrate facing the display substrate. Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display panel.

In some embodiments, the display substrate further includes a plurality of low voltage signal lines respectively extending into the plurality of subpixels. Optionally, a respective one of the plurality of low voltage signal lines electrically connects the first auxiliary cathode with the one or more integrated circuits.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising a plurality of light emitting elements respectively in a plurality of subpixels configured to emit light for image display;
   wherein a respective one of the plurality of subpixels comprises:
   a base substrate;
   a first auxiliary cathode on the base substrate;
   a passivation layer on a side of the first auxiliary cathode away from the base substrate;
   a first insulating layer on a side of the passivation layer away from the base substrate;
   a second auxiliary cathode on a side of the first insulating layer away from the base substrate;
   a second insulating layer on a side of the second auxiliary cathode away from the base substrate; and
   a pixel definition layer on a side of the second insulating layer away from the base substrate;
   wherein the display substrate has a cathode aperture extending through the pixel definition layer and an auxiliary cathode aperture extending through the first insulating layer and the passivation layer;
   a cathode of a respective one of the plurality of light emitting elements extends into the cathode aperture to electrically connect with the second auxiliary cathode; and
   the second auxiliary cathode extends into the auxiliary cathode aperture to electrically connect with the first auxiliary cathode;
   wherein the display substrate further comprises a plurality of low voltage signal lines respectively extending into the plurality of subpixels; and
   wherein a respective one of the plurality of low voltage signal lines is electrically connected to the first auxiliary cathode.

2. The display substrate of claim 1, wherein the cathode of a respective one of the plurality of light emitting elements is substantially outside the auxiliary cathode aperture; and the second insulating layer is substantially inside the auxiliary cathode aperture.

3. The display substrate of claim 1, wherein an orthographic projection of the second auxiliary cathode on the base substrate substantially covers an orthographic projection of the second insulating layer on the base substrate; and the second auxiliary cathode and the second insulating layer together form a substantially flat surface.

4. The display substrate of claim 3, wherein the cathode of the respective one of the plurality of light emitting elements is in direct contact with the second auxiliary cathode and is in direct contact with the second insulating layer; and
   a portion of the cathode of the respective one of the plurality of light emitting elements is on the substantially flat surface.

5. The display substrate of claim 4, wherein a direct contacting interface between the cathode of the respective one of the plurality of light emitting elements and the second auxiliary cathode substantially surrounds a direct contacting interface between the cathode of the respective one of the plurality of light emitting elements and the second insulating layer.

6. The display substrate of claim 3, wherein the respective one of the plurality of subpixels further comprises a third auxiliary cathode on a side of the second auxiliary cathode and the second insulating layer away from the base substrate;
wherein the second insulating layer is sandwiched between the second auxiliary cathode and third auxiliary cathode;
the cathode of the respective one of the plurality of light emitting elements extends into the cathode aperture to electrically connect with the second auxiliary cathode through the third auxiliary cathode; and
the third auxiliary cathode is on the substantially flat surface.

7. The display substrate of claim 6, wherein the cathode of the respective one of the plurality of light emitting elements is in direct contact with the third auxiliary cathode; and
the second auxiliary cathode and the second insulating layer are spaced apart from the cathode of the respective one of the plurality of light emitting elements by the third auxiliary cathode.

8. The display substrate of claim 6, wherein the third auxiliary cathode is in direct contact with the second auxiliary cathode and is in direct contact with the second insulating layer.

9. The display substrate of claim 8, wherein a direct contacting interface between the third auxiliary cathode and the second auxiliary cathode substantially surrounds a direct contacting interface between the third auxiliary cathode and the second insulating layer.

10. The display substrate of claim 6, wherein the second auxiliary cathode, the third auxiliary cathode, and the cathode of the respective one of the plurality of light emitting elements are made of a substantially transparent conductive material; and
the first auxiliary cathode is made of a metallic conductive material.

11. The display substrate of claim 1, wherein the second auxiliary cathode and the cathode of the respective one of the plurality of light emitting elements are made of a substantially transparent conductive material; and
the first auxiliary cathode is made of a metallic conductive material.

12. The display substrate of claim 1, wherein the respective one of the plurality of subpixels further comprises a thin film transistor;
wherein the thin film transistor comprises a source electrode and a drain electrode;
the drain electrode of the thin film transistor is electrically connected to an anode of the respective one of the plurality of light emitting elements; and
the first auxiliary cathode is in a same layer and comprises a same material as the source electrode and the drain electrode of the thin film transistor.

13. The display substrate of claim 1, wherein the first insulating layer and the second insulating layer are made of organic insulating materials.

14. A display substrate, comprising a plurality of light emitting elements respectively in a plurality of subpixels configured to emit light for image display;
wherein a respective one of the plurality of subpixels comprises:
a base substrate;
a first auxiliary cathode on the base substrate;
a passivation layer on a side of the first auxiliary cathode away from the base substrate;
a first insulating layer on a side of the passivation layer away from the base substrate;
a second auxiliary cathode on a side of the first insulating layer away from the base substrate;
a second insulating layer on a side of the second auxiliary cathode away from the base substrate; and
a pixel definition layer on a side of the second insulating layer away from the base substrate;
wherein the display substrate has a cathode aperture extending through the pixel definition layer and an auxiliary cathode aperture extending through the first insulating layer and the passivation layer;
a cathode of a respective one of the plurality of light emitting elements extends into the cathode aperture to electrically connect with the second auxiliary cathode; and
the second auxiliary cathode extends into the auxiliary cathode aperture to electrically connect with the first auxiliary cathode;
wherein the first insulating layer is made of a positive photoresist material the second insulating layer is made of a negative photoresist material; or
the first insulating layer is made of a negative photoresist material, and the second insulating layer is made of a positive photoresist material.

15. A display apparatus, comprising the display substrate of claim 1, and one or more integrated circuits connected to the display substrate.

16. A method of fabricating a display substrate comprising a plurality of light emitting elements respectively in a plurality of subpixels configured to emit light for image display;
wherein forming a respective one of the plurality of subpixels comprises:
forming a first auxiliary cathode on a base substrate;
forming a passivation layer on a side of the first auxiliary cathode away from the base substrate;
forming a first insulating layer on a side of the passivation layer away from the base substrate;
forming a second auxiliary cathode on a side of the first insulating layer away from the base substrate;
forming a second insulating layer on a side of the second auxiliary cathode away from the base substrate; and
forming a pixel definition layer on a side of the second insulating layer away from the base substrate;
wherein the display substrate has a cathode aperture extending through the pixel definition layer and an auxiliary cathode aperture extending through the first insulating layer and the passivation layer;
a cathode of a respective one of the plurality of light emitting elements extends into the cathode aperture to electrically connect with the second auxiliary cathode; and
the second auxiliary cathode extends into the auxiliary cathode aperture to electrically connect with the first auxiliary cathode;
wherein forming the first insulating layer comprises:
forming a first photoresist layer on a side of the passivation layer away from the base substrate; and
exposing the first photoresist layer using a first mask plate and developing the first photoresist layer to form the auxiliary cathode aperture, thereby forming the first insulating layer, the auxiliary cathode aperture extending through the first insulating layer and the passivation layer and exposing a surface of the first auxiliary cathode;

wherein forming the second insulating layer comprises:
forming a second photoresist layer on a side of the first insulating layer and the second auxiliary cathode away from the base substrate; and
exposing the second photoresist layer using a second mask plate and developing the second photoresist layer to form the second insulating layer, wherein the second insulating layer is substantially inside the auxiliary cathode aperture;
wherein the second mask plate is the same as the first mask plate;
wherein the first photoresist layer is made of a positive photoresist material the second photoresist layer is made of a negative photoresist material, or the first photoresist layer is made of a negative photoresist material the second photoresist layer is made of a positive photoresist material.

17. The method of claim 16, subsequent to forming the second insulating layer, further comprising forming the cathode of the respective one of the plurality of light emitting elements;

wherein the cathode of the respective one of the plurality of light emitting elements is in direct contact with the second auxiliary cathode and is in direct contact with the second insulating layer.

18. The method of claim 17, subsequent to forming the second insulating layer and prior to forming the cathode of the respective one of the plurality of light emitting elements, further comprising forming a third auxiliary cathode on a side of the second auxiliary cathode and the second insulating layer away from the base substrate;

wherein the second insulating layer is sandwiched between the second auxiliary cathode and third auxiliary cathode; and the cathode of the respective one of the plurality of light emitting elements extends into the cathode aperture to electrically connect with the second auxiliary cathode through the third auxiliary cathode.

* * * * *